United States Patent
Ho et al.

(10) Patent No.: US 10,782,798 B1
(45) Date of Patent: Sep. 22, 2020

(54) MOUSE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Shih-Hung Ho, Taipei (TW); Hsiao-Lung Chiang, Taipei (TW)

(73) Assignees: LITE-ON ELECTRONICS (GUANGZHOU) LIMITED (CN); LITE-ON TECHNOLOGY CORPORATION (TW)

( * ) Notice: Subject to any disclaimer, the term of this patent is extended or adjusted under 35 U.S.C. 154(b) by 0 days.

(21) Appl. No.: 16/580,832

(22) Filed: Sep. 24, 2019

Related U.S. Application Data

(60) Provisional application No. 62/838,310, filed on Apr. 25, 2019.

(30) Foreign Application Priority Data

Jul. 23, 2019 (CN) .......................... 2019 1 0666420

(51) Int. Cl.
    *G06F 3/0354* (2013.01)

(52) U.S. Cl.
    CPC ................................ *G06F 3/03543* (2013.01)

(58) Field of Classification Search
    None
    See application file for complete search history.

(56) References Cited

U.S. PATENT DOCUMENTS

| | | | |
|---|---|---|---|
| 2007/0251810 A1* | 11/2007 | Corcoran | G06F 3/03543 200/276.1 |
| 2007/0252816 A1* | 11/2007 | Yen | G06F 3/03543 345/163 |
| 2014/0332359 A1* | 11/2014 | Chiang | H01H 21/02 200/339 |
| 2017/0220139 A1* | 8/2017 | Forde | G06F 3/03543 |
| 2018/0136728 A1* | 5/2018 | Unnikrishnan | H01H 13/85 |

* cited by examiner

*Primary Examiner* — Sanjiv D. Patel
(74) *Attorney, Agent, or Firm* — Innovation Counsel LLP

(57) ABSTRACT

A mouse including a main body, a switch module and a pressing component is provided. The switch module includes a switch member. The pressing component is disposed on the main body. The pressing component includes a pivot member, a key portion and an abutting member. The key portion is rotatable with respect to the main body through the pivot member. The abutting member is configured to provide a force for pushing the key portion to abut against the switch member.

16 Claims, 6 Drawing Sheets

MOUSE

This application claims the benefit of U.S. Provisional Application No. 62/838,310, filed Apr. 25, 2019, and the benefit of People's Republic of China patent application Serial No. 201910666420.6, filed Jul. 23, 2019, the invention of which are incorporated by reference herein in its entirety.

BACKGROUND OF THE INVENTION

Field of the Invention

The invention relates in general to a mouse, and more particularly to a mouse capable of improving the user's hand feeling.

Description of the Related Art

Computer has become an indispensable device to modern people in their daily living natter matter they are at work or at rest. When the user uses a computer, mouse is an essential input interface. The user may input commands by clicking the mouse. For most users, the hand feeling of mouse clicking is an essential factor in the selection of mouse. Therefore, how to avoid the mouse's idle stroke being too long and therefore deteriorating the user's hand feeling of mouse clicking has become a prominent task in the design of mouse for the manufacturers.

SUMMARY OF THE INVENTION

The invention is directed to a mouse capable of effectively resolving the problem of idle stroke being too long and affecting the user's hand feeling of mouse clicking and further resolving the problem of the triggering portion getting stuck with the switch member due to an excess pre-stress may be avoided.

According to an embodiment of the present invention, a mouse including a main body, a switch module and a pressing component is provided. The switch module includes a switch member. The pressing component is disposed on the main body. The pressing component includes a pivot member, a key portion and an abutting member. The key portion is rotatable with respect to the main body through the pivot member. The abutting member is configured to provide a force for pushing the key portion to abut against the switch member.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of implementations of the present invention are disclosed below with accompanying drawings. In order to make the disclosure more clearly understood, many details in practice are provided. However, it should be understood that the disclosed details in practice are not for limiting the present invention. That is, in some implementations of the present invention, these details in practice are not necessary. Besides, to simplify the accompanying drawings, some generally known structures and elements are schematically illustrated. Moreover, unless otherwise specified, elements whose designations are common to different accompanying drawings can be regarded as corresponding elements. The accompanying drawings are for clearly illustrating the connection relationship between different elements and do not reflect actual dimensions of each element.

Figure 1:
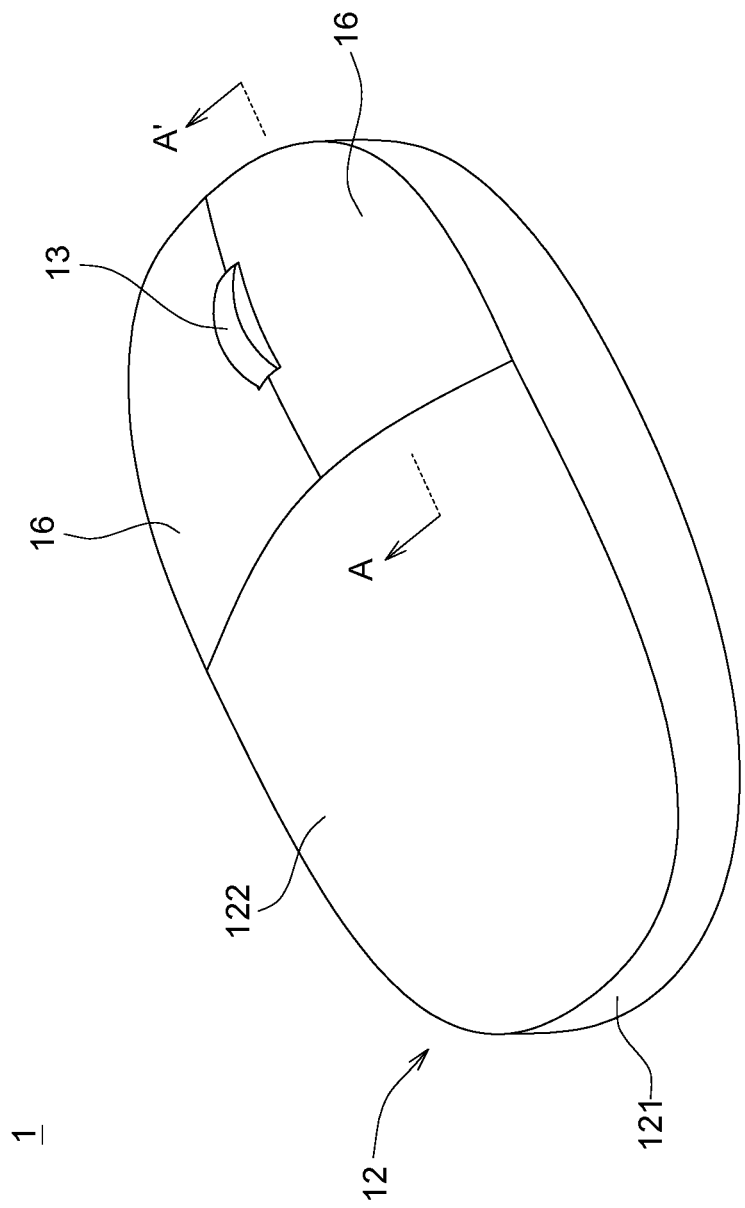
FIG. 1 is a 3D diagram of a mouse according to an embodiment of the present invention.
Figure 2:
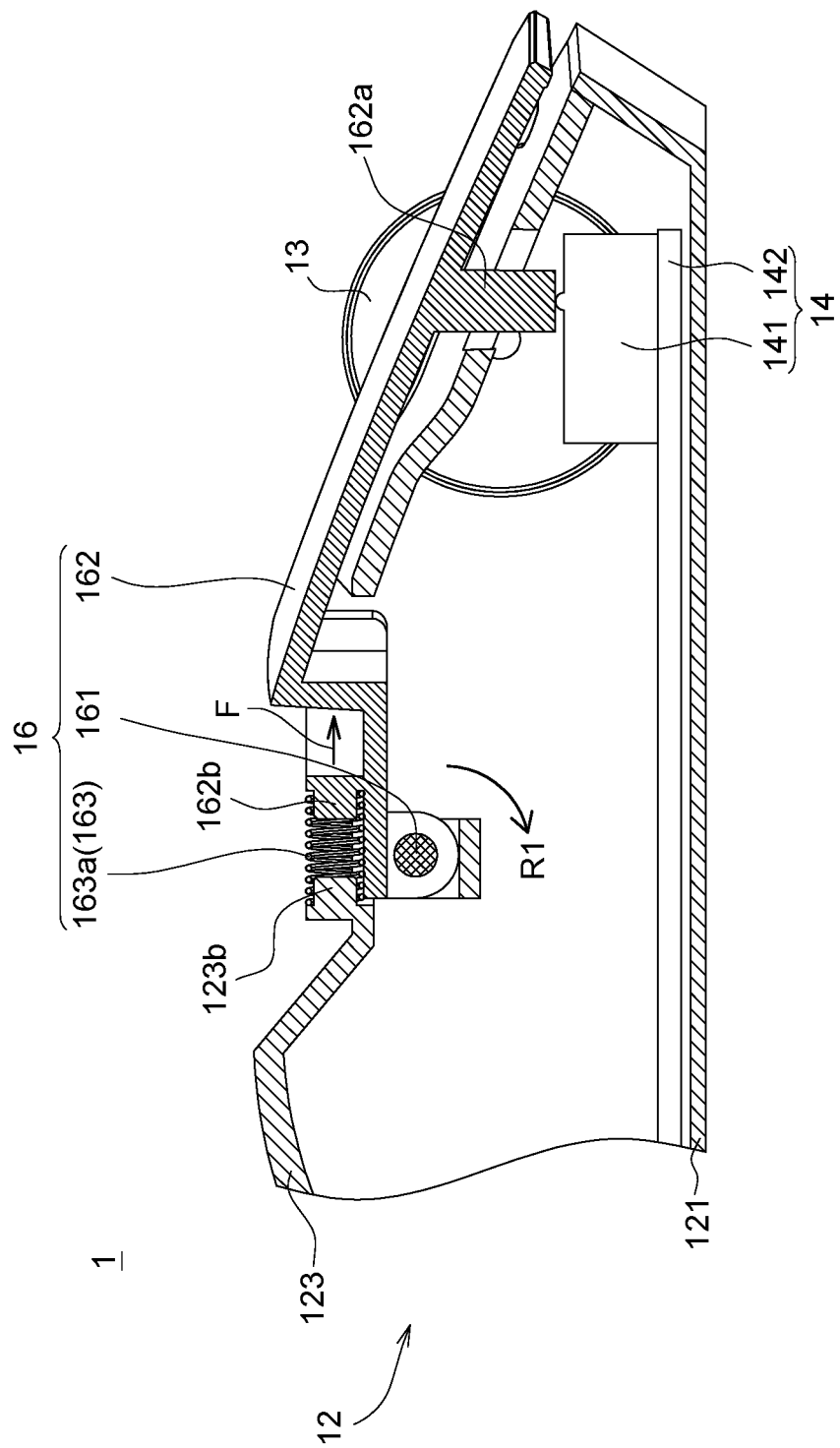
FIG. 2 is a partial cross-sectional view of a mouse according to an embodiment of the present invention.

FIG. 1 is a 3D diagram of a mouse 1 according to an embodiment of the present invention. FIG. 2 is a partial cross-sectional view of a mouse 1 according to an embodiment of the present invention. FIG. 2 is a cross-sectional view along the cross-sectional line A-A' of FIG. 1.

Refer to FIG. 1 and FIG. 2. The mouse 1 includes a main body 12, a roller 13, a switch module 14 and two pressing components 16. The main body 12 may include a lower casing 121, an upper casing 123 and an outer casing 122. The upper casing 123, the lower casing 121 and the outer casing 122 are coupled together. The outer casing 122 covers the upper casing 123. In other embodiment, the outer casing 122 may be omitted, and such omission is allowed in the present invention. The pressing components 16 and the roller 13 are disposed on the main body 12. The roller 13 is disposed between the two pressing components 16.

The outer casing 122 is omitted in FIG. 2 and subsequent drawings, so that the features of the present invention may be more clearly illustrated. Refer to FIG. 2. The switch module 14 includes a switch member 141 and a circuit board 142. The switch member 141 is a micro switch disposed on the circuit board 142 and is electrically connected to the circuit board 142 to trigger a press signal.

Each pressing component 16 includes a pivot member 161, a key portion 162 and an abutting member 163. The key portion 162 is rotatable with respect to the main body 12 through the pivot member 161. The key portion 162 includes a triggering portion 162a extended towards the switch member 141. The abutting member 163 is configured to provide a force F for pushing the key portion 162 to abut against the switch member 141.

The abutting member 163 and the pivot member 161 are disposed adjacently. For example, the abutting member 163 may be disposed above the pivot member 161 separated from the abutting member 163 by the key portion 162. The abutting member 163 provides a force F to the key portion 162. The force F generates a torque having the same direction with the pivot member 161. When the key portion 162 rotates around the pivot member 161 along the first rotation direction R1, the triggering portion 162a of the key portion 162 may naturally touch (without triggering) the switch member 141. Therefore, before the key portion 162 is clicked by the user, there is no gap existing between the triggering portion 162a and the switch member 141. When the user clicks the key portion 162, the user may immediately receive feedback from the operation of pressing the switch member 141, and therefore may have a better hand feeling. Since the triggering portion 162a may naturally touch the switch member 141, the problem of the triggering portion 162a getting stuck with the switch member 141 due to an excess pre-stress may be avoided.

In the embodiment as indicated in FIG. 2, the abutting member 163 is an elastic element 163a, such as a spring. The elastic element 163a is connected to the main body 12 (such as the upper casing 123) and the key portion 162. For example, one end of the elastic element 163a may be disposed on the main body 12, such as the fixing portion 123b mounted on the upper casing 123, to abut against the upper casing 123, and another end of the elastic element 163a may be disposed on the key portion 162, such as the fixing portion 162b mounted on the key portion 162, to abut against the key portion 162. The pivot member 161 is a shaft, which passes through the key portion 162 and the main body 12 (such as the upper casing 123). Thus, the key portion 162 may be pivotally connected to the main body 12 through the pivot member 161. When the pressing component 16 is disposed on the main body 12, the abutting member 163 may provide a force F for rotating the key portion 162 around the pivot member 161 with respect to the main body 12 along the first rotation direction R1. Thus, the triggering portion 162a of the key portion 162 may naturally touch (without triggering) the switch member 141.

Figure 3:
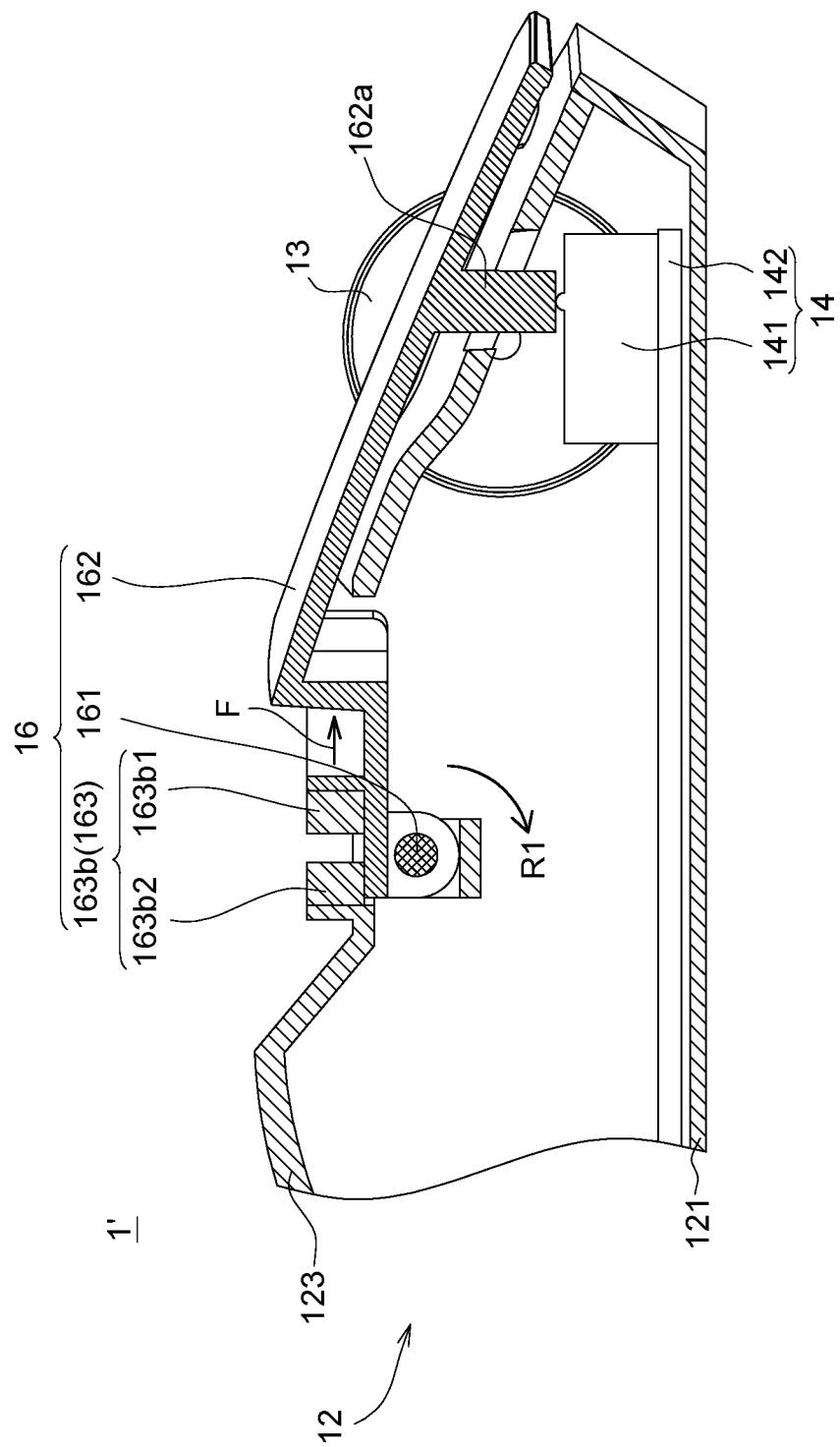
FIG. 3 is a partial cross-sectional view of a mouse according to another embodiment of the present invention.

FIG. 3 is a partial cross-sectional view of a mouse 1' according to another embodiment of the present invention. FIG. 3 is a cross-sectional view along the cross-sectional line A-A' of FIG. 1.

The mouse 1' of FIG. 3 is different from the mouse 1 of FIG. 2 in that the abutting member 163 of the mouse 1' is a magnetic element 163b, such as a set of magnetic elements 163b1 and 163b2 connected to the main body 12 (such as the upper casing 123) and the key portion 162 respectively, wherein the magnetic elements 163b1 and 163b2 have opposite magnetic poles. To put it in greater details, the magnetic elements 163b1 and 163b2 are disposed on the key portion 162 and the main body 12 (such as the upper casing 123) respectively to generate repulsive magnetic forces, such that the magnetic element 163b1 may provide a force F for rotating the key portion 162 around the pivot member 161 with respect to the main body 12 along the first rotation direction R1. Thus, the triggering portion 162a of the key portion 162 may naturally touch (without triggering) the switch member 141.

However, the implementation of the abutting member 163 of the present invention is not limited to the elastic element 163a or the magnetic element 163b exemplified above, and the abutting member 163 of the present invention may be implemented by any elements capable of providing a force F for rotating the key portion 162 around the pivot member 161 with respect to the main body 12 along the first rotation direction R1.

Figure 4:
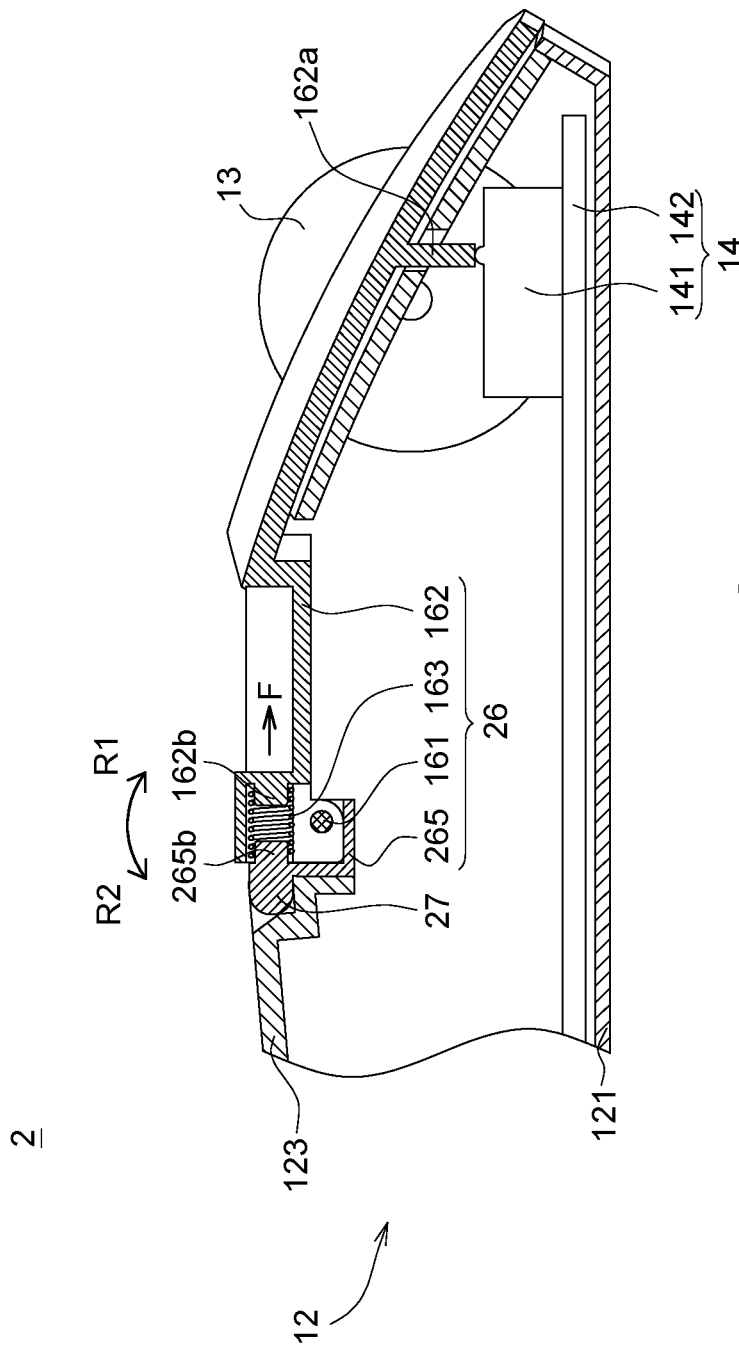
FIG. 4 is a partial cross-sectional view of a mouse according to an alternate embodiment of the present invention.

FIG. 4 is a partial cross-sectional view of a mouse 2 according to an alternate embodiment of the present invention. FIG. 4 is a cross-sectional view along the cross-sectional line A-A' of FIG. 1.

Refer to FIG. 4. The pressing component 26 of the mouse 2 may further include a bearing portion 265 connected to the main body 12 (such as the upper casing 123). The abutting member 163 is connected to the bearing portion 265 and the key portion 162. In an embodiment, the abutting member 163 may be an elastic element, such as the elastic element 163a of FIG. 2. For example, one end of the elastic element may be disposed on the bearing portion 265, such as the fixing portion 265b mounted on the bearing portion 265, to abut against the bearing portion 265, and another end of the elastic element may be disposed on the key portion 162, such as the fixing portion 162b mounted on the key portion 162, to abut against the key portion 162. Thus, the key portion 162 may be pivotally connected to the bearing portion 265 through the pivot member 161. When the pressing component 26 is disposed on the main body 12, the abutting member 163 may provide a force F for rotating the key portion 162 around the pivot member 161 with respect to the bearing portion 265 and the main body 12 along the first rotation direction R1. Thus, the triggering portion 162a of the key portion 162 may naturally touch (without triggering) the switch member 141.

In another embodiment, the abutting member 163 may be a magnetic element, such as a set of magnetic elements 163b1 and 163b2 of FIG. 3 having opposite magnetic poles. For example, the set of magnetic elements having opposite magnetic poles may be disposed on the key portion 162 and the bearing portion 265 respectively to generate repulsive magnetic forces, such that the magnetic elements may provide a force F to the key portion 162.

In the embodiment as indicated in FIG. 4, the bearing portion 265 may be pivotally connected to the main body 12 (such as the upper casing 123). Thus, the pressing component 26 may further rotate with respect to the main body 12 along the second rotation direction R2 for uplifting the pressing component 26. For example, the mouse 2 may further include a pivot shaft 27 disposed on the main body 12 (such as the upper casing 123) and connected to the bearing portion 265, such that the pressing component 264 may be pivotally connected to the main body 12 through the pivot shaft 27. In some embodiments, the pivot shaft 27 may be connected to the bearing portion 265 or integrally formed in one piece with the bearing portion 265.

Figure 5:
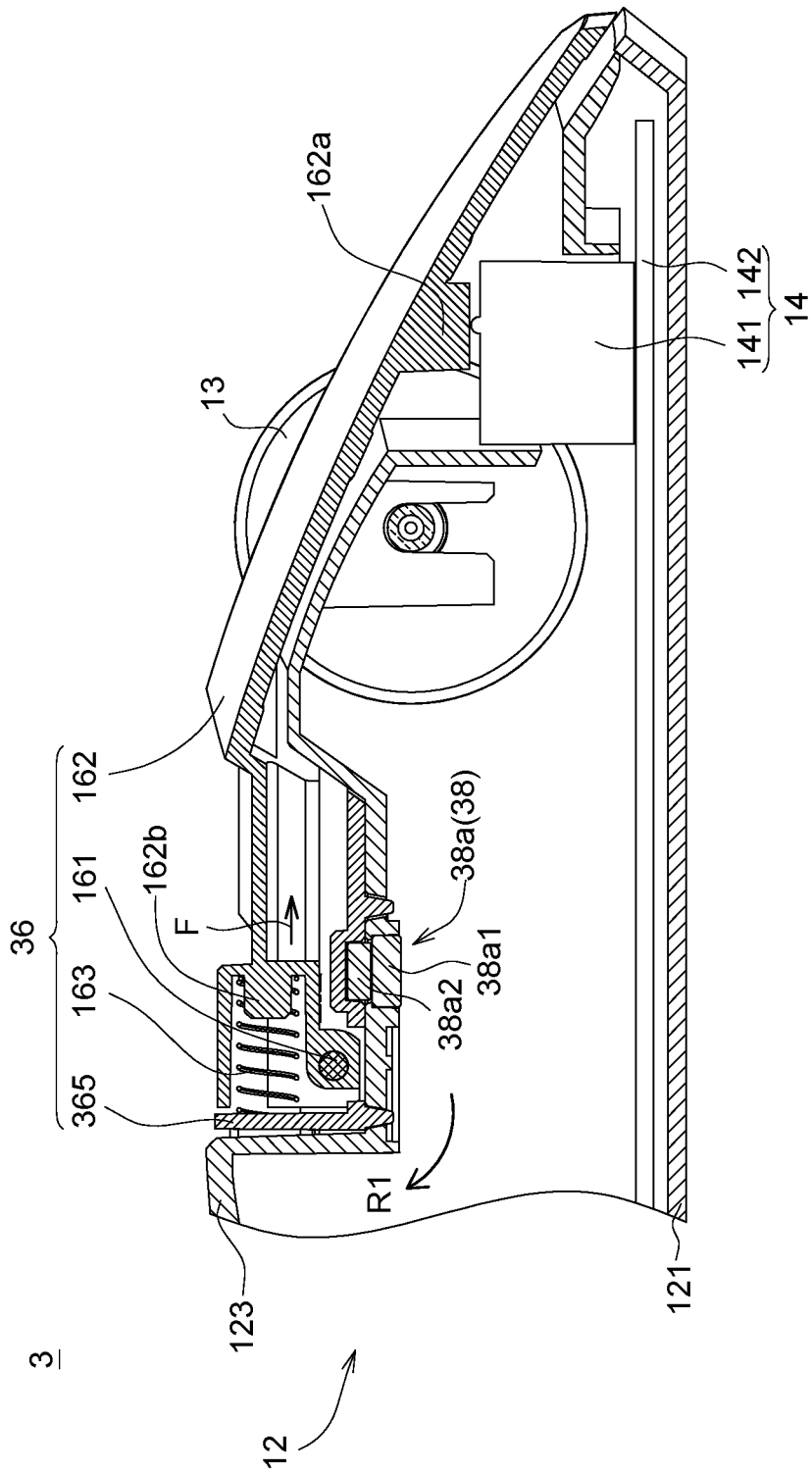
FIG. 5 is a partial cross-sectional view of a mouse according to another alternate embodiment of the present invention.

FIG. 5 is a partial cross-sectional view of a mouse 3 according to another alternate embodiment of the present invention. FIG. 5 is a cross-sectional view along the cross-sectional line A-A' of FIG. 1.

The mouse 3 of FIG. 5 is similar to the mouse 2 of FIG. 4. The pressing component 36 of the mouse 3 also includes a bearing portion 365 connected to the main body 12 (such as the upper casing 123), and the abutting member 163 is connected to the bearing portion 365 and the key portion 162. The form and disposition of the abutting member 163 are similar to the mouse 2 of FIG. 4 and the variations thereof, and the similarities are not repeated here. With the disposition of the abutting member 163, when the pressing component 36 is disposed on the main body 12, the abutting member 163 may provide a force F for rotating the key portion 162 to rotate with respect to the bearing portion 365 and the main body 12 around the pivot member 161 along the first rotation direction R1. Thus, the triggering portion 162a of the key portion 162 may naturally touch (without triggering) the switch member 141.

The mouse 3 of FIG. 5 is different from the mouse 2 of FIG. 4 in that the pressing component 36 of the mouse 3 may be detached from the main body 12. The mouse 3 further includes a coupling element 38 disposed on the main body 12 (such as the upper casing 123) and the bearing portion 365 respectively. The pressing component 36 may be detachably coupled to the main body 12 through the coupling element 38.

In an embodiment as indicated in FIG. 5, the coupling element 38 is magnetic element 38a, such as a set of magnetic elements 38a1 and 38a2 having opposite magnetic poles and disposed on the upper casing 123 and the bearing portion 365 respectively.

Figure 6:
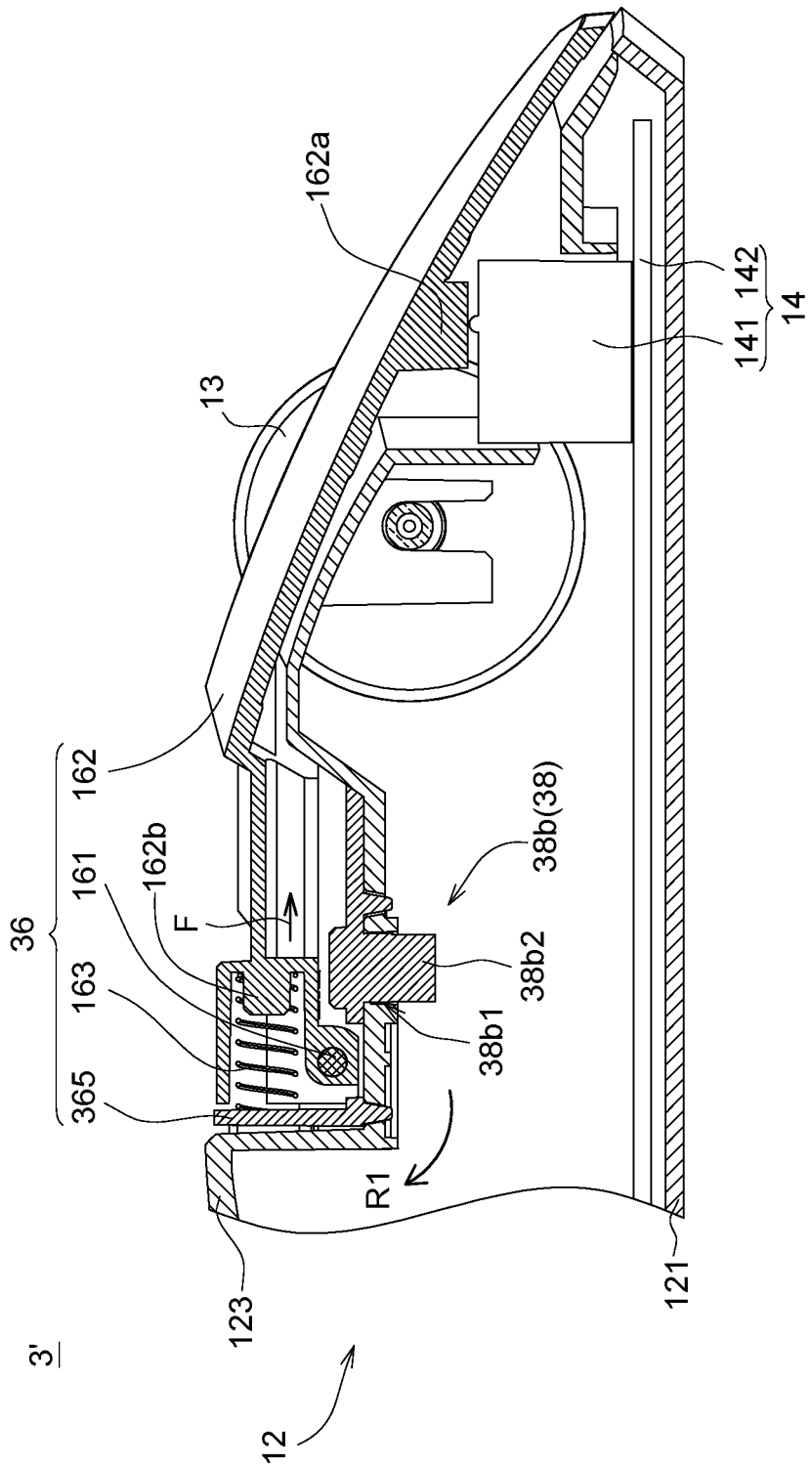
FIG. 6 is a partial cross-sectional view of a mouse according to other embodiment of the present invention.

Refer to FIG. 6 is a partial cross-sectional view of a mouse 3' according to other embodiment of the present invention. FIG. 6 is a cross-sectional view along the cross-sectional line A-A' of FIG. 1. As indicated in FIG. 6, the coupling element 38 may be a set of concave and convex coupling members 38b, such as the hole 38b1 and the protrusion 38b2 with corresponding shapes and quantities. The hole 38b1 and the protrusion 38b2 are disposed on the upper casing 123 and the bearing portion 365 respectively. That is, the hole 38b1 may be disposed on the upper casing 123, and the bearing portion 365 may have a corresponding protrusion 38b2 disposed thereon. Or, the hole 38b1 may be disposed on the bearing portion 365, and the upper casing 123 may have a corresponding protrusion 38b2 disposed thereon. Besides, the protrusion 38b2 may have a columnar shape, a conic shape or any other shape, and the shape of the hole 38b1 may correspond to that of the protrusion 38b2.

With the disposition of the coupling element 38, the user may freely dismount the pressing component 36 from the main body 12 for the convenience of repairing the switch module 14 or other purpose.

Through the embodiments disclosed above, the abutting member may provide a force to the key portion for enabling the triggering portion of the key portion to naturally touch (without triggering) the switch member, and therefore improve the user's hand feeling of mouse clicking.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A mouse comprising:
   a main body;
   a switch module comprising a switch member; and
   a pressing component disposed on the main body, the pressing component comprising:
   a pivot member;
   a key portion rotatable with respect to the main body through the pivot member; and
   an abutting member configured to provide a force for pushing the key portion to abut against the switch member, wherein the abutting member is disposed above the pivot member separated from the abutting member by the key portion.

2. The mouse according to claim 1, wherein the abutting member and the pivot member are disposed adjacently.

3. The mouse according to claim 1, wherein the abutting member is an elastic element.

4. The mouse according to claim 1, wherein the abutting member is a set of magnetic elements having opposite magnetic poles.

5. The mouse according to claim 1, wherein the key portion is pivotally connected to the main body through the pivot member, and the abutting member is connected to the main body and the key portion.

6. The mouse according to claim 5, wherein the abutting member is an elastic element, one end of the elastic element is disposed on the main body, and another end of the elastic element is disposed on the key portion.

7. The mouse according to claim 5, wherein the abutting member is a set of magnetic elements having opposite magnetic poles and disposed on the main body and the key portion respectively.

8. The mouse according to claim 1, wherein the pressing component further comprises:
   a bearing portion, wherein the key portion is pivotally connected to the bearing portion through the pivot member, and the abutting member is connected to the bearing portion and the key portion.

9. The mouse according to claim 8, further comprising:
   a pivot shaft disposed on the main body and connected to the bearing portion;
   wherein the pressing component is pivotally connected to the main body through the pivot shaft.

10. The mouse according to claim 9, wherein the abutting member is an elastic element, one end of the elastic element is disposed on the bearing portion, and another end of the elastic element is disposed on the key portion.

11. The mouse according to claim 9, wherein the abutting member is a set of magnetic elements having opposite magnetic poles and disposed on the bearing portion and the key portion respectively.

12. The mouse according to claim 8, further comprising:
    a coupling element disposed on the main body and the bearing portion respectively;
    wherein the pressing component is detachably coupled with the main body through the coupling element.

13. The mouse according to claim 12, wherein the coupling element is a set of magnetic elements having opposite magnetic poles.

14. The mouse according to claim 12, wherein the coupling element is a protrusion and a hole respectively.

15. The mouse according to claim 12, wherein the abutting member is an elastic element, one end of the elastic element is disposed on the bearing portion, and another end of the elastic element is disposed on the key portion.

16. The mouse according to claim 12, wherein the abutting member is a set of magnetic elements having opposite magnetic poles and disposed on the bearing portion and the key portion respectively.

* * * * *